March 3, 1959 P. W. KOENIG 2,876,399

SEMICONDUCTOR DEVICES

Filed April 24, 1957

INVENTOR:
PAUL W. KOENIG,

BY Julius J. Zaskalicky
HIS ATTORNEY

United States Patent Office 2,876,399
Patented Mar. 3, 1959

2,876,399

SEMICONDUCTOR DEVICES

Paul W. Koenig, Clyde, N. Y., assignor to General Electric Company, a corporation of New York Application April 24, 1957, Serial No. 654,710

10 Claims. (Cl. 317—234)

The present invention relates to mounting structures for semiconductor devices and has as an object thereof to provide improvements in the assembly of semiconductor devices to facilitate handling of and heat removal from such devices.

Another object of the present invention is to provide a mounting structure which on the one hand is simple to make and occupies a minimum of space, and on the other hand is easy to handle without damage to electrical leads or other parts thereof and is highly effective in removing heat from the semiconductor device mounted thereon.

A further object of the present invention is to provide a new and improved mounting structure for semiconductor devices suitable for dip-solder mounting in printed circuit boards.

In many applications a plurality of semiconductor devices are required to provide the desired performance. In power supplies, for example, a number of rectifier units are often required to produce the necessary rectification for a particular application. In such cases the problem of mounting the devices arises. In the past rectifier units have been mounted to one another by bolting or riveting them together and then bolting them to electrical equipment. Such mounting arrangements are expensive, bulky and generally difficult to handle.

Accordingly, it is also an object of the present invention to provide a new and improved composite rectifier structure which is easy to make, compact and readily adaptable for initial mounting and replacement in electrical equipment.

In carrying out the present invention in one illustrative form thereof there is provided a conductive cooling plate and a semiconductor device having an electrode thereof mounted in conductive contact with one portion of the plate. Another portion of the cooling plate is provided with a contact for making electrical connections thereto. Means are provided for making electrical connections to the other electrodes of the device.

In carrying out the present invention in another form thereof, a molded body of insulating material is provided with a plurality of spaced slots and a plurality of holes transversing the spaced slots. Angular-shaped cooling fins having semiconductor devices mounted thereon are fitted into said slots and are secured therein by piercing or dimpling the cooling fins through said holes in the body of insulating material. The fins are so shaped and the semiconductor devices are so mounted that no electrical connections, except the terminals, or semiconductor devices are exposed. This method of mounting is simple, and less time-consuming than known methods, producing devices which are compact and easy to handle without damage to leads or other parts thereof.

These and other advantages of this invention will be more clearly understood from the following description taken in connection with the accompanying drawings, and its scope will be apparent from the appended claims.

Figures 1, 2, 3, 5:
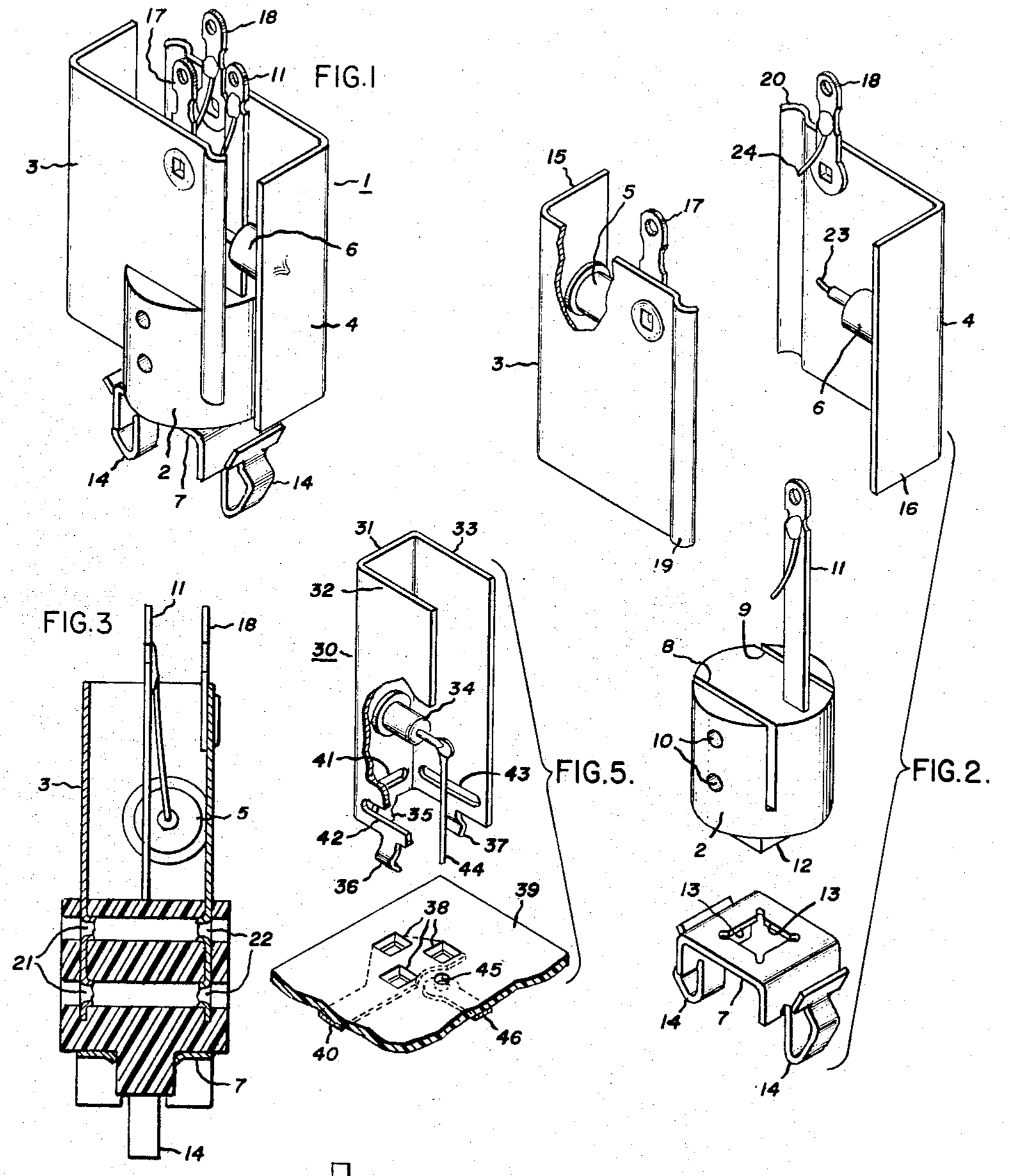
Figure 1 shows an isometric view of a mounting structure in accordance with the present invention.
Figure 2 shows an exploded view of the structure shown in Figure 1.
Figure 3 shows a cross-sectional view of the structure shown in Figure 1.
Figure 5 shows an isometric view of another mounting structure in accordance with the present invention.

Referring now to Figures 1 and 2, there is shown an illustrative embodiment 1 of the present invention comprising a molded body or base member 2, a pair of cooling plates or fins 3 and 4, semiconductor rectifiers 5 and 6 mounted on fins 3 and 4, respectively, and a spring clip 7. Body or base member 2 is a molded body of insulating material having a pair of spaced slots 8 and 9 therein and holes 10 therethrough transversing slots 8 and 9. A terminal pin 11 is also molded in body member 2. Seat 12 is provided on one extremity of body member 2. Spring clip 7 is held in frictional engagement with seat 12 by arm members 13 on spring clip 7 which protrude outward and downward from the plane of the top of the clip. With such a construction, the clip is easily inserted into the seat 12, but is removed with difficulty due to the bending action of the arms 13 against the seat 12. Spring clip 7 has a pair of resilient plugs 14 adapting the device to be plugged into a receptacle on an electrical chassis.

Cooling fins 3 and 4 have flanged or angled portions 15 and 16, respectively, to which are mounted semiconductor devices 5 and 6, respectively. Each of the cooling fins is in good thermal and electrical contact with one of the electrodes of a respective semiconductor device. Terminal pins 17 and 18 are mounted on cooling fins 3 and 4, respectively. The pins 17 and 18 may be formed integral with the fins 3 and 4. Cooling fins 3 and 4 are also provided with grooved end portions 19 and 20, respectively. These grooves are provided to facilitate the positioning of the cooling fins in slots 8 and 9 of body member 2 and to strengthen the fin itself.

As will be seen more clearly in Figure 3, when the cooling fins have been positioned in the slots 8 and 9, the fins may be secured to body member 2 by running a punch through holes 10 to pierce fin 3 at points 21 and fin 4 at points 22. This piercing or dimpling operation firmly locks the cooling fins in the body member 2. As shown in Figure 3, fins 3 and 4 have been pierced by punches from both sides providing a firm grip. It would be possible to punch completely through from one side of body member 2, but the operation shown is preferred due to the fact that the central portion of body member 2 is able to withstand more pressure than the outer areas which have been somewhat weakened by the presence of slots 8 and 9, even though outer area is supported by holding fixture during the piercing operation.

The assembled device is shown in Figure 1. It presents a compact structure, both in size and shape. Electrical leads 23 and 24 interconnect semiconductor rectifiers 5 and 6. In this illustrative embodiment, semiconductor devices 5 and 6 are serially connected, with lead 23 being connected between a terminal of one polarity of semiconductor device 6 and terminal 11, and lead 24 being connected between the terminal of the same polarity of semiconductor device 5 and terminal 18. Terminals 11 and 17 are adapted to be connected to an external circuit. It is obvious that any particular kind of connection to an external circuit would depend on particular operating requirements, and the invention is not considered limited to specific circuit connections shown.

The particular configuration of assembled devices shown in Figure 1 represents a small and compact rectifying unit. The angular-type construction of cooling fins 3 and 4 allows a reduction in size of the rectifier stack. This may be illustrated by considering the use of the commonly employed flat fins. If flat fins were used to provide the same heat dissipation as the angled fins, they would of necessity encompass a larger overall area. The distance between flat fins is governed by the size of the semiconductor devices and their terminal connections as well as by heat transfer principles. By mounting the semiconductor devices on the angled portions of fins 12 and 18, closer spacing is possible because the semiconductor rectifiers and their mountings have a greater length than width dimension. The width dimension of the semiconductor device limits the separation of fins in the angled configuration whereas the length dimension of the semiconductor device would be controlling in the flat fin configuration commonly employed in prior art stacking arrangements. It is thus readily apparent that in using the angled fins a highly efficient heat dissipation arrangement is provided. It should also be noted that the fins enclose the semiconductor devices and their internal connections. Consequently, the device may be handled by grasping the fins without harming or injuring in any way the devices or electrical connections to the devices. The devices may be plugged into receptacles without risk of contacting exposed electrical leads.

The body member 2 may be elongated to accommodate a larger number of fins than is shown in the present embodiment. The exact number will depend on circuit requirements. The body member then can consist of a cylindrical body member having its major axis in a horizontal plane rather than in the vertical plane as shown in the present embodiment.

The structure shown and embodying this invention provides a simple, inexpensive stacking arrangement which facilitates the handling of rectifier stacks in both production and in application.

Figure 4:
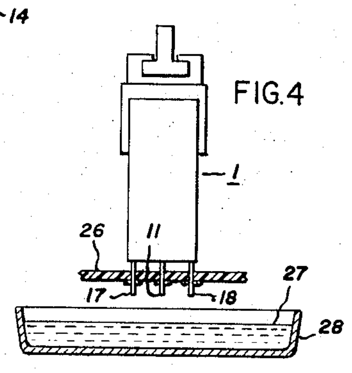
Figure 4 shows the structure of Figure 1 dip-soldered on a printed circuit board.

Figure 4 illustrates another outstanding advantage of the present invention. It will be noted that the electrical terminals 11, 17 and 18 project from one end of the device. This arrangement is particularly suitable for plugging the device into a printed wiring board for dip-soldering as shown in Figure 4. The rectifier stack 1 is plugged into a printed soldering board 26, lowered to contact the solder 27 in container 28, thus making it possible to solder the rectifier stack in place in a matter of seconds. In this particular instance, seat 12 on body member 2 and spring clip 7 may be eliminated.

Referring now to Figure 5, there is shown another mounting unit particularly suitable for individual mounting on an electrical chassis. Of course, a plurality of such units could be mounted on a molded body as shown in Figure 1, if desired. The unit comprises a planar fin member or plate 30 having a base portion 31 and two side portions 32 and 33, substantially at right angles to the base portion. Semiconductor device 34, which for purposes of illustration is shown as a rectifier, is centrally mounted on the base portion 31 with an electrode thereof in good conductive contact with the fin member. One end of the fin member is provided with a plurality of tabs 35, 36 and 37 on the base portion 31 and side portions 32 and 33, respectively, for supporting the fin member on a chassis or in receptacles 38 of printed circuit board 39 or other suitable support, and for making electrical connection to conductor 40 on the board. The tabs 35, 36 and 37 are detented, as shown, to facilitate fastening of the fin member to the board. On the base portion 31 and side portions 32 and 33 of the fin adjacent the tabs 35, 36 and 37 are provided openings or slots 41, 42 and 43, respectively, which function to impede the flow of heat from the tabs to the semiconductor device. As the tabs may be subject to high temperatures in soldering to a circuit board, the slots are particularly advantageous in keeping the high temperature of a solder bath, for example, from heating the device to a temperature which would destroy it. Some semiconductor devices are ruined if heated to beyond 100° C., and others can withstand temperatures as high as 200° C. while the temperature of a soldering bath may be much higher. Lead 44 which preferably is made of substantial stock provides a conductive connection to the external circuit in which the device is used. As shown, the lead 44 is adapted to fit into receptacle 45 on printed circuit board 39 to make connection with conductor 46. The entire unit may be soldered in place in the manner described in connection with Figure 4. Accordingly, it is seen that I have provided a mounting structure which is easy to manufacture, occupies a relatively small area on any electrical chassis and is readily attached to suitable support means such as a printed circuit board.

Since other modifications varied to fit particular operating requirements and environments will be apparent to those skilled in the art, my invention is not considered limited to the examples chosen for purposes of disclosure and covers all changes and modifications which do not constitute departures from the true spirit and scope of my invention.

What I claim as new and desire to secure by Letters Patent of the United States is:

1. In combination, a conductive cooling plate, a semiconductor device having an electrode thereof mounted in conductive contact with one portion of said plate, another portion of said plate including a tab for making electrical connection to an external circuit, that portion of said plate between said one portion and said other portion being formed to provide a high impedance to the flow of heat energy therebetween, and means for making electrical connections to the other electrodes of said device.

2. In combination, a conductive cooling plate, a semiconductor device having an electrode thereof mounted in conductive contact with one portion of said plate, another portion of said plate including a tab for making electrical connections to an external circuit, that portion of said plate between said one portion and said other portion having an opening therein to provide a high impedance to the flow of heat between said one portion and said othehr portion while inappreciably affecting the resistance to flow of electrical current therebetween, and means for making electrical connections to the other electrodes of said device.

3. In combination, a conductive cooling planar member having an angled end portion, a semiconductor device having an electrode thereof mounted in conductive contact with one portion of said member, another portion of said member including a tab for making electrical connections to an external circuit, that portion of said plate between said one portion and said other portion being formed to provide a high impedance to the flow of heat energy therebetween, and means for making electrical connections to the other electrodes of said device.

4. In combination, a conductive cooling planar member, a rectifying device having an electrode thereof mounted in conductive contact with one portion of said member, another portion of said member including a tab for making electrical connections to an external circuit, that portion of said plate between said one portion and said other portion being formed to provide a high impedance to the flow of heat energy therebetween, said planar member being formed to enclose said rectifying device, and means for making connection to the other electrode of said device.

5. A semiconductor device mounting comprising a body member of insulating material having a plurality of slots therein and at least one hole therethrough transversing said plurality of slots, a plurality of cooling fins each of which is adapted to fit into a respective one of said plurality of slots, said cooling fins being secured in said slots by piercing said cooling fins in said hole, and a plurality of semiconductor devices each mounted on a respective one of said cooling fins in heat exchanging relationship therewith.

6. A semiconductor device assembly comprising a body member of insulating material having a pair of spaced slots therein and at least one hole therethrough transversing said slots, a pair of cooling fins each fitted in a respective one of said slots and adapted to be secured in said body member by dimpling said fins in said hole, and a plurality of semiconductor devices each mounted on a respective one of said fins in heat exchanging relationship therewith.

7. A semiconductor device assembly comprising a base member of insulating material having spaced slots therein and a plurality of holes therethrough, said holes transversing said slots, a plurality of cooling fins each having a semiconductor device mounted thereon in heat exchanging relationship therewith and secured in each of said slots by pierced portions of said fins in said holes.

8. A semiconductor device assembly comprising a base member of insulating material having spaced slots therein and a plurality of holes therethrough, said holes transversing said slots, a plurality of cooling fins each having a flanged end portion, each of said fins secured in a respective one of said slots by pierced portions of said fins in said holes, a plurality of semiconductor devices each mounted on said flanged end portion of a respective one of said cooling fins in heat exchanging relationship therewith, said cooling fins positioned in said slots such that a pair of said fins substantially surrounds each of said semiconductor devices.

9. A semiconductor device assembly comprising a body member of insulating material having a pair of spaced slots therein and at least one hole therethrough transversing said solts, a pair of cooling fins each fitted in a respective one of said slots and adapted to be secured in said body member by dimpling said fins in said hole, each of said fins having an angled end portion thereon, a plurality of rectifiers each mounted on said angled end portions of a respective one of said fins in heat exchanging relationship therewith, said fins being mounted such that each of said rectifiers are substantially enclosed by said fins.

10. A rectifier assembly comprising a body member of insulating material having a plurality of slots therein and at least one hole therethrough transversing said plurality of slots, a plurality of cooling fins each of which is adapted to fit into a respective one of said slots, said cooling fins having a grooved end portion and an angled end portion, said grooved end portion adapted to position said fins in said slots, a plurality of semiconductor rectifiers each mounted on said angled end portions of a respective one of said cooling fins in heat exchanging relationship therewith, said cooling fins being secured in said slots by pierced portions of said fins in said holes.

References Cited in the file of this patent

UNITED STATES PATENTS 2,730,663 Harty ---------------- Jan. 10, 1956